United States Patent
Lee et al.

(10) Patent No.: US 8,867,255 B2
(45) Date of Patent: Oct. 21, 2014

(54) SEMICONDUCTOR DEVICE AND METHOD OF OPERATION

(71) Applicant: SK hynix Inc., Icheon-si (KR)

(72) Inventors: Joo Hyeon Lee, Bucheon-si (KR); Jun Hyun Chun, Yongin-si (KR); Ho Uk Song, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 51 days.

(21) Appl. No.: 13/845,192

(22) Filed: Mar. 18, 2013

(65) Prior Publication Data

US 2014/0177313 A1   Jun. 26, 2014

(30) Foreign Application Priority Data

Dec. 21, 2012   (KR) ........................ 10-2012-0150998

(51) Int. Cl.
 *G11C 17/00* (2006.01)
 *G11C 17/16* (2006.01)
 *G11C 8/10* (2006.01)
 *G11C 29/00* (2006.01)

(52) U.S. Cl.
 CPC *G11C 17/16* (2013.01); *G11C 8/10* (2013.01); *G11C 29/787* (2013.01); *G11C 17/165* (2013.01)
 USPC .................. 365/96; 365/230.06; 365/236

(58) Field of Classification Search
 CPC ........ G11C 17/165; G11C 17/16; G11C 8/10; G11C 29/787
 See application file for complete search history.

(56) References Cited

U.S. PATENT DOCUMENTS

| | | | |
|---|---|---|---|
| 5,808,944 A * | 9/1998 | Yoshitake et al. | 365/200 |
| 5,953,264 A * | 9/1999 | Hirano et al. | 365/200 |
| 6,130,853 A * | 10/2000 | Wang et al. | 365/230.06 |
| 7,206,246 B2 * | 4/2007 | Nakashima et al. | 365/222 |
| 7,764,559 B2 * | 7/2010 | Nakashima et al. | 365/222 |
| 2009/0027939 A1 | 1/2009 | Kang | |
| 2011/0013469 A1 | 1/2011 | Park et al. | |
| 2011/0205796 A1 | 8/2011 | Kim | |

* cited by examiner

*Primary Examiner* — Gene Auduong
(74) *Attorney, Agent, or Firm* — William Park & Associates Patent Ltd.

(57) ABSTRACT

A semiconductor device and method of operation having reduced read time of fuse array information during boot-up operation. When fuse array information is read, only repaired fuse-set information is read such that a read time of the semiconductor memory device is reduced, resulting in an increased read margin.

16 Claims, 3 Drawing Sheets

SEMICONDUCTOR DEVICE AND METHOD OF OPERATION

CROSS-REFERENCE TO RELATED APPLICATION

This application claims priority based upon Korean patent application No. 10-2012-0150998, filed on Dec. 21, 2012, the disclosure of which is hereby incorporated in its entirety by reference herein.

BACKGROUND OF THE INVENTION

The present invention relates generally to a semiconductor device and method of operation, and more particularly to a technology for reducing read time of a semiconductor device including a fuse array.

A semiconductor memory device includes numerous memory cells. As fabrication technology has improved, the degree of integration of semiconductor memory devices has also increased, such that the number of memory cells has rapidly increased. If a defect occurs in one of the memory cells, there is a high probability that the corresponding semiconductor memory device will fail to perform properly. Generally, semiconductor memory devices in which defective memory cells are detected are simply discarded.

However, with improved fabrication technology of semiconductor memory devices, defects occur in only a small number of memory cells. Even though failures may only occur in a fraction of the cells of the semiconductor memory device, the entire semiconductor memory device is discarded as a defective product, so production yield is detrimentally affected. In order to solve the above-mentioned problem, the semiconductor memory device may further include normal memory cells and redundant memory cells.

SUMMARY

Various embodiments of the present invention are directed to providing a semiconductor device that substantially obviates one or more problems due to limitations and disadvantages of the related art.

Example embodiments of the present invention relate to a technology for reducing a read time of fuse array information during the boot-up operation of the semiconductor memory device.

In accordance with an embodiment of the present invention, a semiconductor device includes: a fuse array configured to include a plurality of fuse-sets; a counting unit configured to count a column read signal; a decoding unit for decoding an output signal of the counting unit, and outputting the decoding result to the fuse array; and a read controller for controlling a read operation region of the fuse array in response to a read control signal and a second execution signal received from the counting unit.

In accordance with an embodiment of the present invention, a method for operating a semiconductor device, the method comprising the steps of: providing a fuse array including a plurality of fuse-sets, wherein the fuse-sets include information relating to repaired memory cells and non-repaired memory cells; and controlling operation of a read controller to determine a read operation region of the fuse array such that only information relating to repaired memory cells is read from the fuse array.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Figure 1:
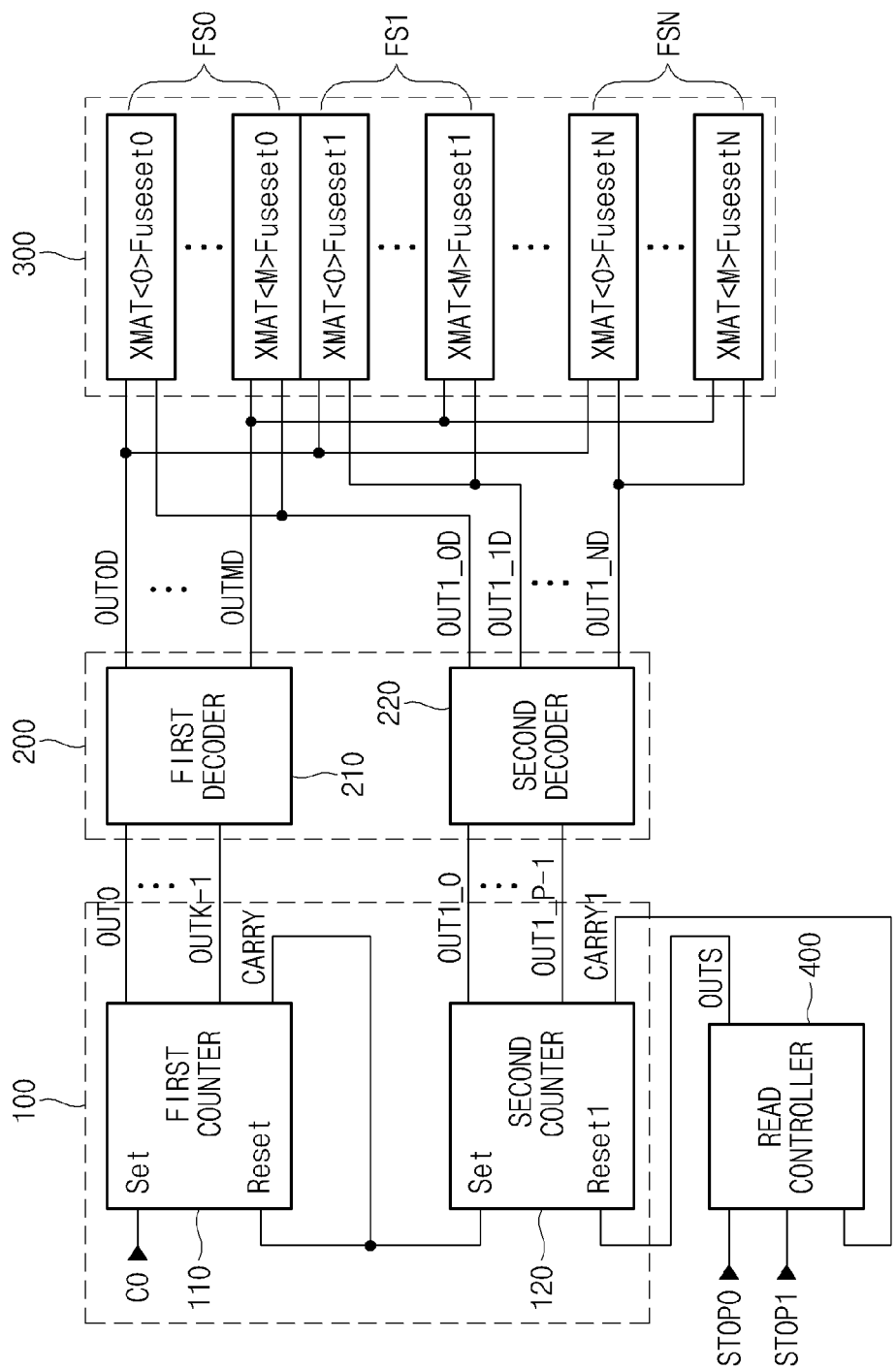
FIG. 1 is a block diagram illustrating a semiconductor device according to an embodiment of the present invention.

Embodiments of the present invention are described below in more detail with reference to the accompanying drawings. The present invention may, however, be embodied in different forms and should not be construed as limited to the embodiments set forth herein.

A redundancy control circuit may be used to solve the defective memory cell problem mentioned briefly above. If a defect occurs in any one of the memory cells, the redundancy control circuit recognizes the occurrence of the defect in the cell through testing. Thereafter, upon receiving an access request for the corresponding cell, the redundancy control circuit switches the connection to a cell contained in the redundancy circuit, instead of proceeding with the requested connection to the defective cell. The redundancy circuit is effectively an aggregate of redundant memory cells, and can be used as a substitute for a defective cell.

If a defect occurs in a normal memory cell, a redundancy memory cell is used to repair the defective memory cell (hereinafter referred to as a repair-target memory cell to be repaired).

Specifically, if the repair-target memory cell is accessed in the read and write operations, a normal memory cell instead of the repair-target memory cell is accessed. In actuality, however, the accessed memory cell is a redundancy memory cell. Therefore, if an address corresponding to the repair-target memory cell is input to the semiconductor memory device, the semiconductor memory device performs the operation for accessing the redundancy memory cell instead of the repair-target memory cell, and normal operation of the semiconductor memory device can be achieved through the above-mentioned repairing operation.

As a general principle, the semiconductor memory device must include not only the redundancy memory cell but also other circuits to perform the repair operation, and a representative example of the other circuits is a repair fuse circuit. The repair fuse circuit is used to store an address (hereinafter referred to as a repair-target address) corresponding to the repair-target memory cell. The repair fuse circuit is configured to program the repair-target address in a fuse. The semiconductor device is configured to perform the repair operation using the programmed repair-target address.

Since each constituent element of the semiconductor integrated circuit (IC) device becomes miniaturized in size and the number of elements contained in a single semiconductor chip is greatly increased by virtue of this miniaturization, defect density is also increased. The increasing defect density may directly affect productivity in semiconductor device fabrication. If defect density increases to a critical level, a wafer on which semiconductor devices are formed may have to be discarded.

In order to reduce the defect density, a redundancy circuit for replacing a defective cell with a redundant cell has been proposed. The redundancy circuit (or fuse circuit) may be installed at each of a row-based line (for example, a word line) and a column-based line (for example, a bit line) of the semiconductor memory device.

The redundancy circuit includes a fuse array for storing address information of a defective cell. The fuse array includes a plurality of fuse sets, each of which includes a plurality of fuse lines. Each fuse-set is configured to program information by melting or blowing the fuse using an overcurrent.

FIG. 1 is a block diagram illustrating a semiconductor device according to an embodiment of the present invention.

Referring to FIG. 1, the semiconductor device includes a counting unit 100, a decoding unit 200, a fuse array 300, and a read controller 400.

The counting unit 100 includes a first counter 110 and a second counter 120. The counting unit 100 counts a column read signal C0 during the read period, and outputs the counted result to the decoding unit 200.

The first counter 110 counts a column read signal C0 so that it outputs a plurality of counting signals OUT0~OUTK−1 and an execution signal CARRY. The number of counting signals OUT0~OUTK−1 output from the first counter 110 is set to K.

The column read signal C0 is input to a set terminal of the first counter 110, and the execution signal CARRY is input to a reset terminal of the first counter 110. That is, the first counter 110 starts the counting operation in response to the column read signal C0, and stops the counting operation in response to the execution signal CARRY.

The second counter 120 counts the number of execution signals CARRY, each of which is an output signal of the first counter 110, such that the second counter 120 outputs a plurality of counting signals OUT1_0~OUT1_P−1 and an execution signal CARRY1. The execution signal CARRY is input to a set terminal (Set) of the second counter 120, and an output signal OUTS of the read controller 400 is input to a reset terminal (Reset1). That is, after the first counter 110 stops operation, the second counter 120 starts the counting in response to the execution signal CARRY and stops the counting in response to the output signal OUTS.

The decoding unit 200 includes a first decoder 210 and a second decoder 220. The decoding unit 200 decodes the output signal of the counting unit 100, and outputs the decoded signal to the fuse-set of the corresponding fuse array 300.

The first decoder 210 decodes a plurality of counting signals OUT0~OUTK−1 so that it outputs a plurality of decoding signals OUT0D~OUTMD. The number of output decoding signals OUT0D~OUTMD of the first decoder 210 is denoted by M+1. The second decoder 220 decodes a plurality of counting signals OUT1_0~OUT1_P−1 so that it outputs a plurality of decoding signals OUT1_0D~OUT1_ND.

The output decoding signal OUT0D of the first decoder 210 is input to a first fuse-set XMAT<0> of each fuse-set group FS0~FSN. The output decoding signal OUTMD of the first decoder 210 is input to the last fuse-set XMAT<M> of each fuse-set group FS0~FSN.

The decoding signal OUT1_0D output from the second decoder 220 is input to a first fuse-set group FS0. In addition, the decoding signal OUT1_1D output from the second decoder 220 is input to a second fuse-set group FS1. In addition, the decoding signal OUT1_ND output from the second decoder 220 is input to the last fuse-set group FSN.

The fuse array 300 includes a plurality of fuse-set groups FS0~FSN. Each fuse-set group FS0~FSN includes a plurality of fuse-sets XMAT<0> ~XMAT<M> configured on a mat (matrix) basis. That is, each fuse-set group FS0~FSN includes N fuse-sets.

The fuse array 300 includes a plurality of fuse-sets XMAT<0>~XMAT<M> in row and column lines so that a matrix structure may be achieved. The fuse array 300 is configured to select a row line corresponding to mat selection information.

The fuse array 300 stores address information of a defective cell according to a rupture operation. The fuse array 300 outputs information stored in each fuse-set XMAT<0>~XMAT<M> to a bit line sense-amplifier (not shown) upon receiving the decoding signal from the decoding unit 200. The bit line sense-amplifier senses and amplifies address information received from the fuse array 300 in response to the read signal, and outputs the amplified result to a fuse data line. Each fuse-set XMAT<0>~XMAT<M> may be comprised of an electric fuse (E-fuse) configured to program information by blowing a fuse using an over current.

The read controller 400 generates the output signal OUTS for controlling the read operation region of the fuse array 300 according to read control signals (STOP0, STOP1) and an execution signal CARRY1. The read controller 400 outputs the output signal OUTS to the reset terminal (Reset1) of the second counter 120 according to read control signals (STOP0, STOP1) and the execution signal CARRY1.

Therefore, the read controller 400 is configured to control the reset operation of the second counter 120 according to the read control signals (STOP0, STOP1) and the execution signal CARRY1. The read controller 400 is configured to read some repaired fuse-sets from among a plurality of fuse-sets XMAT<0>~XMAT<M> according to the execution signal CARRY1.

The operations of the semiconductor memory device according to an embodiment of the present invention will hereinafter be described with reference to FIGS. 2 and 3.

Figure 2:
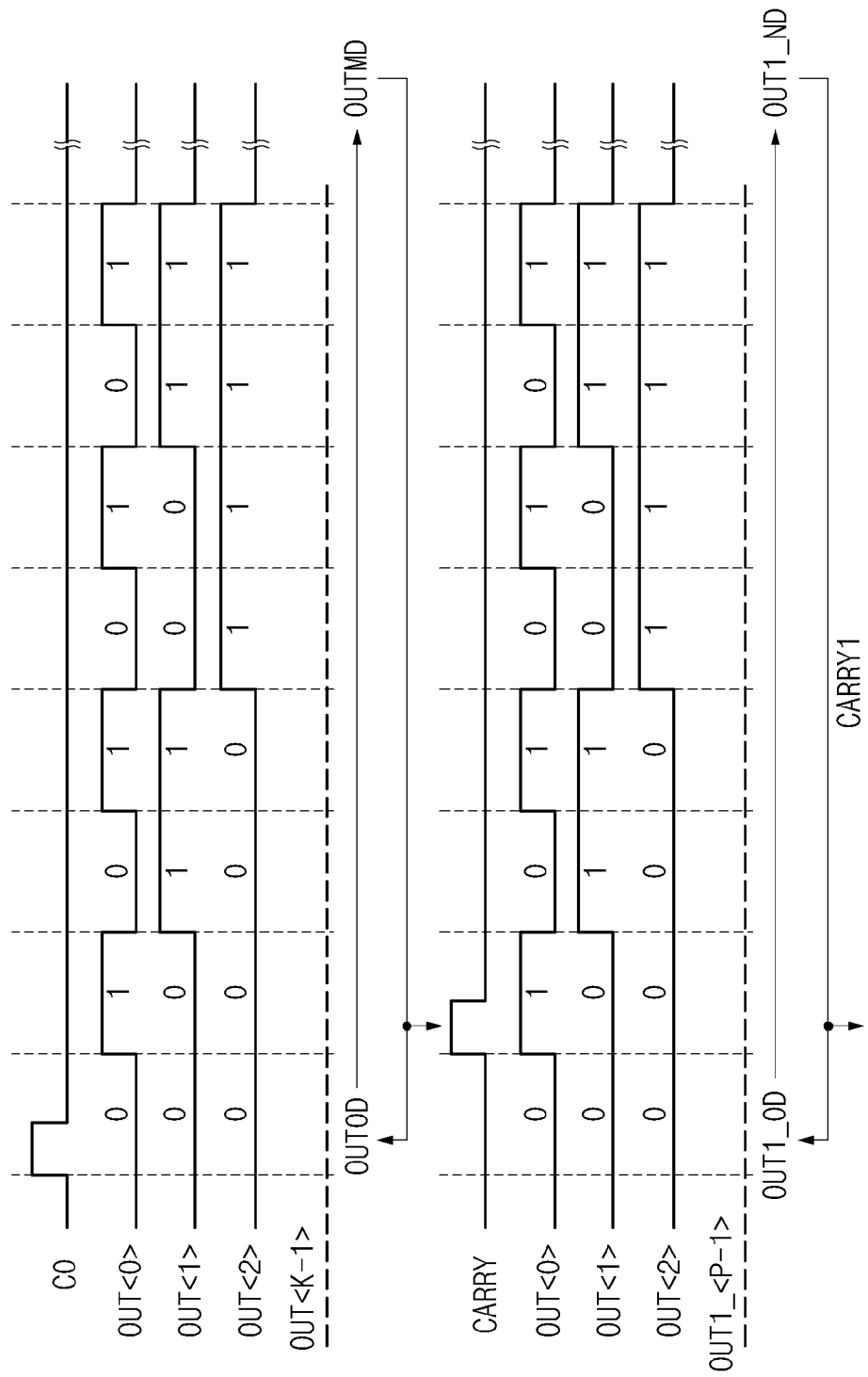
FIG. 2 is a timing diagram illustrating the read operation of a general semiconductor device.

FIG. 2 is a timing diagram illustrating the read operation of a general semiconductor device. FIG. 3 is a timing diagram illustrating the read operation of a semiconductor device according to an embodiment of the present invention.

Figure 3:
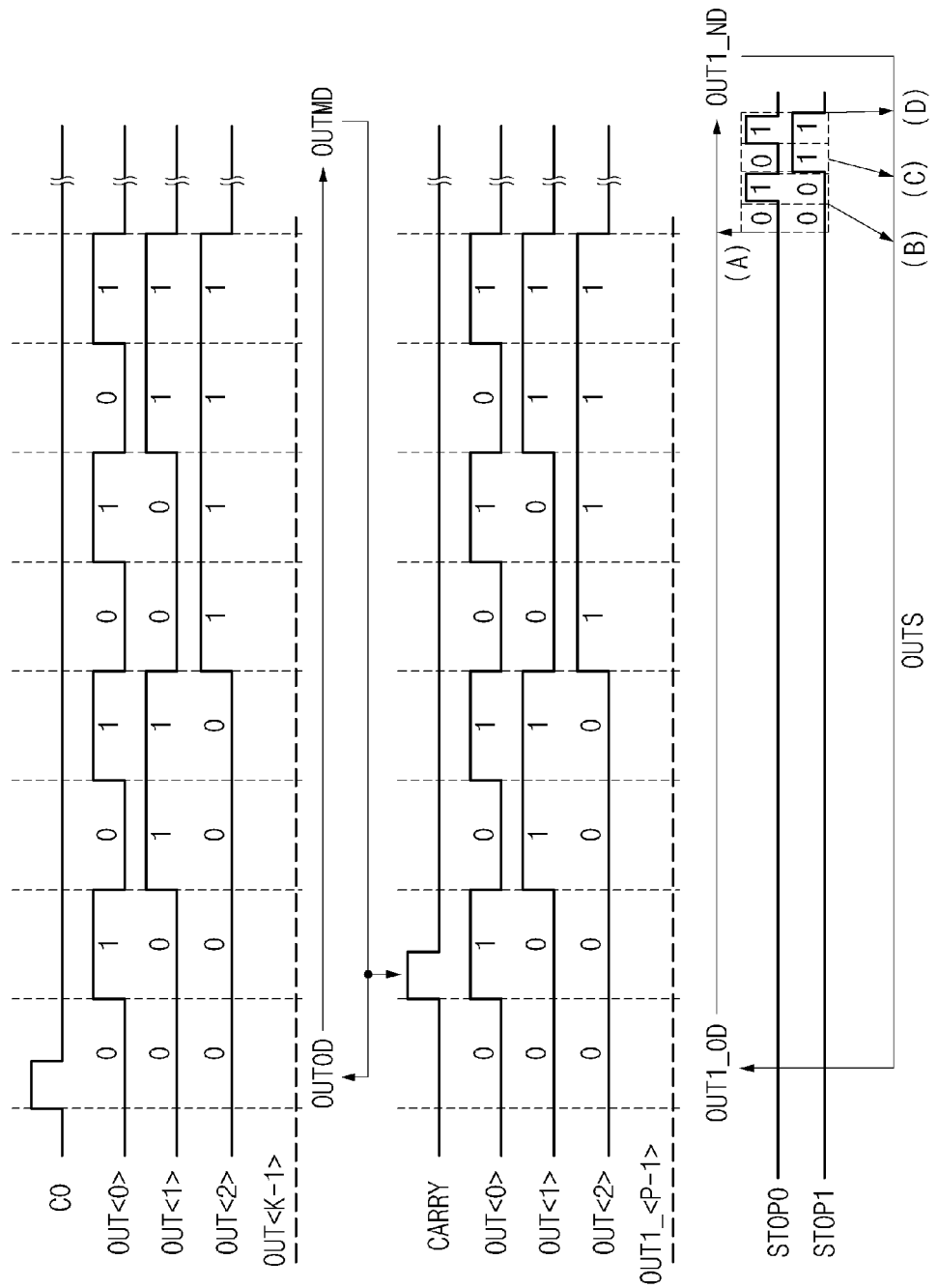
FIG. 3 is a timing diagram illustrating the read operation of a semiconductor device according to an embodiment of the present invention.

Referring to FIGS. 2 and 3, the semiconductor device according to an embodiment of the present invention is configured to start a boot-up operation such that it can read information of the fuse array 300 in response to a power-up signal. If the boot-up operation is activated, the first counter 110 starts the counting operation in response to the column read signal C0.

The first counter 110 counts the number of column read signals C0 so that it outputs a plurality of counting signals OUT0~OUTK−1 to the first decoder 210. The first counter 110 stops the counting operation in response to the execution signal CARRY. The execution signal CARRY is fed back to the reset terminal (Reset) of the first counter 110 so that the reset operation is controlled, and the execution signal CARRY is output to the set terminal (Set) of the second counter 120.

Thereafter, the second counter 120 starts the counting operation in response to the execution signal CARRY corresponding to the output signal of the first counter 110, and outputs a plurality of counting signals OUT1_0~OUT1_P−1 to the second decoder 220 by counting the number of execution signals CARRY. The second counter 120 is configured to output the execution signal CARRY1 to the read controller 400.

In this case, the output signal OUTS of the read controller 400 is input to the reset terminal (Reset1) of the second counter 120. That is, the first counter 120 starts the counting operation in response to the execution signal CARRY after completion of the first counter 110, and stops the counting operation in response to the output signal OUTS.

Subsequently, the first decoder 210 decodes a plurality of counting signals OUT0~OUTK−1 so that it outputs a plurality of decoding signals OUT0D~OUTMD to each fuse-set group FS0~FSN of the fuse array 300. The second decoder 220 decodes a plurality of counting signals OUT1_0~OUT1_P−1 so that the decoding signals OUT1_0D~OUT1_ND are sequentially output to respective fuse-set groups FS0~FSN.

In this case, the decoding signal OUT0D output from the first decoder 210 is input to a first fuse-set XMAT<0> of each fuse-set group FS0~FSN. The decoding signal OUTMD output from the first decoder 210 is input to the last fuse-set XMAT<M> of each fuse-set group FS0~FSN.

Therefore, the fuse array 300 can sequentially read a plurality of fuse-sets from a first fuse-set XMAT<0> to the last fuse-set XMAT<M> of each fuse-set group FS0~FSN upon receiving a plurality of decoding signals OUT0D~OUTMD. If the read operation of the fuse array 300 is performed, defective-cell address information stored in a plurality of fuse-sets from the first fuse-set XMAT<0> to the last fuse-set XMAT<M> may be sequentially or simultaneously read.

The decoding signal OUT1_0D output from the second decoder 220 is input to a first fuse-set group FS0. In addition, the second decoding signal OUT1_1D output from the second decoder 220 is input to a second fuse-set group FS1. In addition, the last decoding signal OUT1_ND output from the second decoder 220 is input to the last fuse-set group FSN.

Accordingly, the fuse array 300 sequentially reads a plurality of fuse-set groups FS0~FSN according to a plurality of decoding signals OUT1_0D~OUT1_ND. If the read operation of the fuse array 300 is performed, defective-cell address information stored in fuse-sets XMAT<0>~XMAT<M> of individual fuse-set groups FS0~FSN is sequentially read.

In this case, the read controller 400 generates an output signal OUTS for controlling a read operation region of the fuse array 300 according to a combination of the execution signal CARRY1 and the read control signals (STOP0, STOP1). The read controller 400 outputs the output signal OUTS to the reset terminal (Reset1) of the second counter 120 in response to the read control signals (STOP0, STOP1) and the execution signal CARRY1. Therefore, the read controller 400 controls the reset operation of the second counter 120 according to a combination of the execution signal CARRY1 and the read control signals (STOP0, STOP1).

For example, if it is desired to read only some repaired fuse-set groups during the read operation of the fuse array 300, a state of the output signal OUTS is changed so that the counting operation of the second counter 120 is reset. Under the normal operation state, the execution signal CARRY1 is used as a control signal for stopping the read operation of the fuse array 300. In contrast, if only the repaired fuse is to be read, the counting operation of the second counter 120 is terminated in response to the output signal OUTS.

In this case, information indicating which region includes some repaired fuse-set groups from among a plurality of fuse-set groups FS0~FSN may be pre-established according to product test information at an initial development stage of the semiconductor device. That is, the above-mentioned information indicating which region includes some repaired fuse-set groups from among a plurality of fuse-set groups FS0~FSN may include read control signals (STOP0, STOP1). Therefore, a user may arbitrarily establish the read region of the fuse array 300 by controlling a combination state of the read control signals (STOP0, STOP1).

For example, the read control signals (STOP0, STOP1) may be contained in 'Power Ramp and Initialization Sequence' of DDR3 specification of a main memory, and a separate input pin for each read control signal STOP0 or STOP1 may be allocated as necessary.

The reset operation of the second counter 120 is controlled according to the output signal OUTS, such that the read operation of the fuse array 300 may be stopped at a desired time during the read operation of the fuse array 300. Assuming that the execution signal CARRY1 is activated, the read operation stops although the read operation of all fuse-sets of the fuse array 300 is not all completed.

Table 1 shows a control scheme for controlling a read termination time by changing state information of the output signal OUTS according to state information of the read control signals (STOP0, STOP1).

TABLE 1

| State of Output Signal (OUTS) corresponding to Read Control Signals (STOP0, STOP1) | | | | |
|---|---|---|---|---|
| Read Control Signal STOP0 | L | H | L | H |
| Read Control Signal STOP1 | L | L | H | H |
| Output Signal OUTS | CARRY1 | OUT1_N/4 | OUT1_N/2 | OUT1_N*3/4 |

As can be seen from Table 1, if the low-level read control signals (STOP0, STOP1) are input to the semiconductor device, the output signal OUTS of the read controller 400 operates as the execution signal CARRY1. That is, as can be seen from FIG. 4(A), the read operation of all fuse-sets of the fuse array 300 is performed until the execution signal CARRY1 is activated by a normal counting operation of the second counter 120.

If a high-level read control signal STOP0 and a low-level read control signal STOP1 are input to the semiconductor device, the output signal OUTS of the read controller 400 is activated at a ¼ output time point of the decoding signal OUT1_ND. For example, as can be seen from (B) of FIG. 3, if there are four decoding signals OUT1_0D~OUT1_ND, the read operation is controlled at an output start time (corresponding to a ¼ output time point) of the decoding signal OUT1_0D. That is, after only information regarding the fuse-set group FS0 is read according to the decoding signal OUT1_0D, the read operation is completed.

If a low-level read control signal STOP0 and a high-level read control signal STOP1 are input to the semiconductor device, the output signal OUTS of the read controller 400 is activated at a ½ output time point of the decoding signal OUT1_ND. For example, if there are four decoding signals OUT1_0D~OUT1_ND as shown in (C) of FIG. 3, the read operation is controlled at an output time point (corresponding to a ½ time point) of the decoding signal OUT1_1D. That is, after only information regarding the fuse-set groups (FS0, FS1) is read according to the decoding signal OUT1_1D, the read operation is completed.

In addition, if high-level read control signals (STOP0, STOP1) are input to the semiconductor device, the output signal OUTS of the read controller 400 is activated at a ¾ output time point of the decoding signal OUT1_ND. For example, if there are four decoding signals OUT1_0D~OUT1_ND as shown in (C) of FIG. 3, the read operation is controlled at an output time point (corresponding to a ¾ time point) of the decoding signal OUT1_2D. That is, after only information regarding the fuse-set groups FS0~FS2 is read according to the decoding signal OUT1_2D, the read operation is completed.

During normal operation, fuse information of the fuse array 300 is read during the activation period of the boot-up operation as shown in FIG. 2. That is, after all the decoding signals OUT0D~OUTMD are output according to the operations of the first counter 110 and the first decoder 210, the first counter 110 stops operation in response to the execution signal CARRY.

After the second counter 120 and the second decoder 220 are operated in response to the execution signal CARRY so as to output the decoding signals OUT1_0D~OUT1_ND, the execution signal CARRY1 is activated. That is, upon completion of a predetermined read period after activation of the boot-up operation, the second counter 120 stops counting in response to the execution signal CARRY1 so that the boot-up operation is completed.

The read operation of the fuse array 300 is continued during the boot-up operation period in a normal operation mode. Fuse information must be read from a DRAM before the actual internal memory is operated by the fuse array 300.

However, as memory capacity is gradually increased in density, capacity of a repaired fuse is also increased. Therefore, if the read operation of the fuse-sets of the fuse array 300 is performed during the boot-up operation, the number of read times is excessively increased and the read time is also increased. That is, both repaired information and non-repaired information from among fuse information of the fuse array 300 are read, such that an overall read time unavoidably increases.

Although information of the fuse array 300 can be simultaneously read to reduce the read time, it is very important to reduce the read time so as to prepare for skew variation or fabrication considerations for various products.

Although each fuse-set contained in the semiconductor chip stores repair information therein, it should be noted that fuse-sets are not all used by the chip. Therefore, the semiconductor device according to an embodiment of the present invention reads only some fuse-sets used for repairing from among the fuse array 300 according to the read control signals (STOP0, STOP1), such that the read time is reduced and the read operation margin can be improved.

As is apparent from the above description, when fuse array information is read during the boot-up operation of the semiconductor device, only repaired fuse-set information can be read such that a read time of the semiconductor memory device is reduced, resulting in an increased read margin.

While certain embodiments have been described above, it will be understood by those skilled in the art that the embodiments described are by way of example only. Accordingly, the semiconductor memory device and methods of operation described herein should not be limited based on the described embodiments. Rather, the semiconductor memory device and methods of operation described herein should only be limited in light of the claims that follow, when taken in conjunction with the above description and accompanying drawings.

Embodiments of the present invention have been disclosed above for illustrative purposes. Those skilled in the art will appreciate that various modifications, variations, and substitutions are possible, without departing from the spirit and scope of the invention as set forth in the accompanying claims.

What is claimed is:

1. A semiconductor device comprising:
   a fuse array configured to include a plurality of fuse-sets;
   a counting unit configured to count a column read signal;
   a decoding unit for decoding an output signal of the counting unit, and outputting the decoding result to the fuse array; and
   a read controller for controlling a read operation region of the fuse array in response to a read control signal and a second execution signal received from the counting unit.

2. The semiconductor device according to claim 1, wherein the fuse array is classified into a plurality of fuse-set groups.

3. The semiconductor device according to claim 1, wherein the counting unit includes:
   a first counter for outputting a plurality of first counting signals and a first execution signal by counting the column read signal; and
   a second counter for outputting a plurality of second counting signals and the second execution signal by counting the output signal of the first counter.

4. The semiconductor device according to claim 3, wherein the first counter receives the column read signal through a set terminal, and receives the first execution signal through a reset terminal.

5. The semiconductor device according to claim 3, wherein the second counter receives the first execution signal through a set terminal, and receives an output signal of the read controller through a reset terminal.

6. The semiconductor device according to claim 3, wherein the decoding unit includes:
   a first decoder for outputting a plurality of first decoding signals by decoding the plurality of first counting signals; and
   a second decoder for outputting a plurality of second decoding signals by decoding the plurality of second counting signals.

7. The semiconductor device according to claim 6, wherein:
   the fuse array is classified into a plurality of fuse-set groups,
   a first decoding signal from among the plurality of first decoding signals is input to a first fuse-set of the first fuse-set group, and
   the last decoding signal from among the plurality of second decoding signals is input to the last fuse-set of the first fuse-set group.

8. The semiconductor device according to claim 6, wherein:
   the fuse array is classified into a plurality of fuse-set groups,
   a first decoding signal from among the plurality of second decoding signals is input to a first fuse-set group, and
   the last decoding signal from among the plurality of second decoding signals is input to the last fuse-set group.

9. The semiconductor device according to claim 1, wherein the read controller is configured to control a reset operation of the counting unit in response to the read control signal and an output signal of the counting unit.

10. The semiconductor device according to claim 1, wherein the read controller is controlled to read only some repaired fuse-sets from among the plurality of fuse-sets in response to an output signal of the counting unit.

11. The semiconductor device according to claim 1, wherein the read controller establishes a read operation region of the fuse array in response to a combination of logic values of a first read control signal and a second read control signal from among the read control signals.

12. The semiconductor device according to claim 1, wherein the plurality of fuse-sets includes an electric fuse (E-fuse).

13. A method for operating a semiconductor device, the method comprising the steps of:

providing a fuse array including a plurality of fuse-sets, wherein the fuse-sets include information relating to repaired memory cells and non-repaired memory cells; and controlling operation of a read controller to determine a read operation region of the fuse array such that only information relating to repaired memory cells is read from the fuse array.

14. The method in accordance with claim 13, wherein the step of controlling operation of a read controller further comprises the steps of:

providing a counting unit configured to count a column read signal; and controlling operation of the read controller to read only fuse-sets including information relating to repaired memory cells from among the plurality of fuse-sets, in response to an output signal of the counting unit.

15. The method in accordance with claim 14, wherein the counting unit comprises:

a first counter for outputting a plurality of first counting signals and a first execution signal by counting the column read signal; and a second counter for outputting a plurality of second counting signals and the second execution signal by counting the output signal of the first counter.

16. The method in accordance with claim 15, wherein the read controller controls a read operation region of the fuse array in response to a read control signal and a second execution signal received from the counting unit.

* * * * *